United States Patent
Chiang et al.

(10) Patent No.: US 9,281,400 B1
(45) Date of Patent: Mar. 8, 2016

(54) METHOD OF FABRICATING A SEMICONDUCTOR DEVICE WITH FIN-SHAPED STRUCTURES

(71) Applicant: UNITED MICROELECTRONICS CORP., Hsin-Chu (TW)

(72) Inventors: Huai-Tzu Chiang, Tainan (TW); Sheng-Hao Lin, Hsinchu County (TW); Hsin-Yu Chen, Nantou County (TW); Hao-Ming Lee, Taichung (TW); Tzyy-Ming Cheng, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/726,620

(22) Filed: Jun. 1, 2015

(30) Foreign Application Priority Data

Apr. 8, 2015 (TW) .............................. 104111326 A (51) Int. Cl.
H01L 21/339 (2006.01)
H01L 29/78 (2006.01)
H01L 21/8234 (2006.01)

(52) U.S. Cl.
CPC .... H01L 29/7848 (2013.01); H01L 21/823418 (2013.01); H01L 21/823431 (2013.01); H01L 21/823481 (2013.01); H01L 21/823493 (2013.01)

(58) Field of Classification Search
CPC ....................... H01L 21/82341; H01L 29/7848
USPC ............................................................ 438/157
See application file for complete search history.

(56) References Cited

U.S. PATENT DOCUMENTS

| 4,799,990 | A | 1/1989 | Kerbaugh |
| 5,429,988 | A | 7/1995 | Huang |
| 7,569,857 | B2 | 8/2009 | Shaheen |
| 2015/0311123 | A1* | 10/2015 | Zhu ................. H01L 21/823821 257/401 |
| 2015/0333086 | A1* | 11/2015 | Liu ................... H01L 29/66795 257/347 |

* cited by examiner

*Primary Examiner* — David S Blum
(74) *Attorney, Agent, or Firm* — Winston Hsu; Scott Margo (57) ABSTRACT

A method of fabricating a semiconductor device with fin-shaped structures includes respectively forming first fin-shaped structures in a first region and a second region of a semiconductor substrate, depositing a dielectric layer to completely cover the first fin-shaped structures, removing the first fin-shaped structures in the second region so as to form trenches in the dielectric layer, and performing an in-situ doping epitaxial growth process so as to respectively form second fin-shaped structures in the trenches.

20 Claims, 6 Drawing Sheets

METHOD OF FABRICATING A SEMICONDUCTOR DEVICE WITH FIN-SHAPED STRUCTURES

BACKGROUND OF THE INVENTION

1. Field of the Invention

The present invention relates generally to the field of semiconductor devices, and more particularly to a method of fabricating a semiconductor device with fin-shaped structures.

2. Description of the Prior Art

As semiconductor devices' switching speeds continue to increase and operating voltage levels continue to decrease, the performances of metal-oxide-semiconductor filed effect transistors (MOSFETs) and other types of transistors, such as bipolar junction transistors, need to be correspondingly improved. Currently, along with the development of the MOSFETs, one of the main goals in the industry is to increase the carrier mobility so as to further increase the operation speed of the MOSFETs.

Accordingly, crystal strain technology has been developed recently and is becoming more and more attractive as a means for getting better performances in the field of MOS transistor fabrication. Specifically, the mobility of charge carriers, such as electrons or holes, in a MOS transistor can be increased when the certain amount of tensile stress or compressive stress is applied to the channel region of the MOS transistor. Currently, attempts have been made to use a strained silicon layer as a part of MOS transistors in which an epitaxial silicon germanium (SiGe) structure or an epitaxial silicon carbide (SiC) structure is formed. In this type of MOS transistor, a biaxial tensile strain is induced in the epitaxy silicon layer due to the difference in lattice constants between SiGe or SiC and Si. As a result, the band structure is altered, and the carrier mobility is increased.

However, due to the continuous shrinkage in the size of the semiconductor devices, the devices merely adopting the strain-silicon structure are no longer suitable for the semiconductor industry. For example, for a semiconductor device with more than one transistor with different conductive types, it is important about how to effectively adjust electrical properties of carrier channels in the transistors, such as threshold voltage ($V_{TH}$), and to incorporate the strained-silicon technology concurrently.

SUMMARY OF THE INVENTION

According to one embodiment of the present invention, a method of fabricating a semiconductor device with fin-shaped structures is disclosed and includes the following steps: respectively forming first fin-shaped structures in a first region and a second region of a semiconductor substrate; depositing a dielectric layer to completely cover the first fin-shaped structures; removing the first fin-shaped structures in the second region so as to form trenches in the dielectric layer; and performing an in-situ doping epitaxial growth process so as to respectively form second fin-shaped structures in the trenches.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles.

FIG. 1 to FIG. 11 are schematic diagrams showing a fabrication method of a semiconductor device according to embodiments of the present invention, where:

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 1:
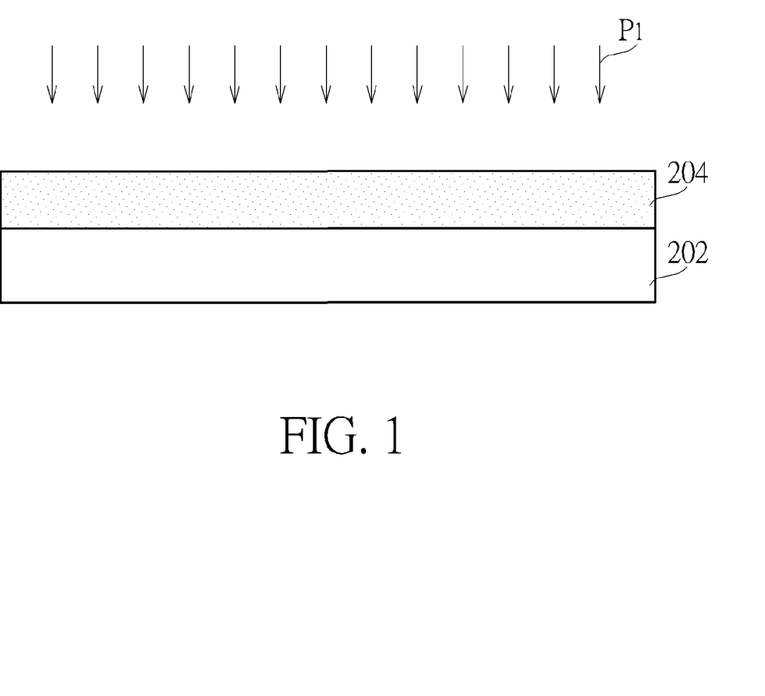
FIG. 1 is a cross-sectional diagram showing a semiconductor device at the beginning of a fabrication process.

FIG. 1 to FIG. 11 are schematic diagrams showing a method of fabricating a semiconductor device according to embodiments of the present invention. FIG. 1 is a cross-sectional diagram showing a semiconductor device at the beginning of a fabrication process. At this stage, an ion-implantation process P1 is carried out to implant dopants into a semiconductor substrate 202 and thereby form at least a doped region 204 in an upper portion of the semiconductor substrate 202. The doped region 204 may be used as a well region or a punch-through stopper region to electrically connect or isolate different regions of the semiconductor substrate 202. Preferably, the doped region 204 shown in FIG. 1 has a specific conductivity type and uniform dopant concentration, but is not limited thereto. For different requirements, the doped region 204 in different regions of the semiconductor substrate 202 may have different conductivity types and dopant concentrations.

The semiconductor substrate 202 may be a silicon substrate, a silicon containing substrate, a III-V semiconductor-on-silicon (such as GaAs-on-silicon) substrate, a graphene-on-silicon substrate or a silicon-on-insulator (SOI) substrate, but is not limited thereto.

Figure 2:
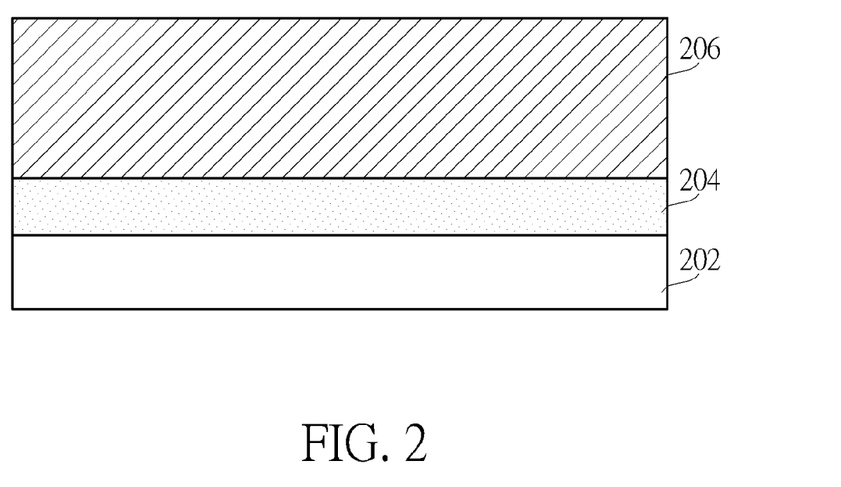
FIG. 2 is a cross-sectional diagram showing a semiconductor substrate with epitaxial layer.

FIG. 2 is a cross-sectional diagram showing a semiconductor substrate with epitaxial layer. After the process of forming the doped region 204, one or more epitaxial growth processes may be carried out to thereby form a single-crystalline epitaxial layer 206 on the semiconductor substrate 202. Specifically, the epitaxial growth processes are in-situ epitaxial growth processes so that dopants with specific conductivity type, such as boron, carbon, phosphor, arsenic or other IIIA or VA elements, may be implanted into the epitaxial layers 206. Preferably, the epitaxial layer 206 has a first conductivity type, and the concentration of the epitaxial layer 206 may increase from bottom to top gradually, but is not limited thereto.

Figure 3:
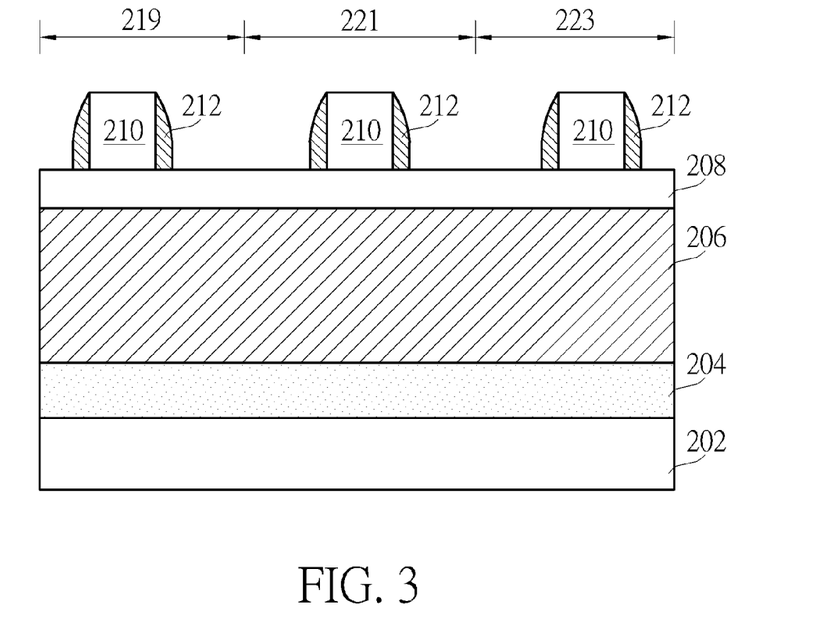
FIG. 3 is a cross-sectional diagram showing a semiconductor substrate with a hard mask.

FIG. 3 is a cross-sectional diagram showing a semiconductor substrate with a hard mask, a patterned sacrificial layer and spacers thereon. After the process of forming the epitaxial layer 206, a hard mask 208 and a sacrificial layer (not shown) are then sequentially disposed on the epitaxial layer 206. Then, a suitable patterning process, such as a photo-etching process (PEP), a multi-patterning process, a spacer self-aligned double-patterning (SADP) process, or a sidewall image transfer (SIT) process, may be carried out to pattern the sacrificial layer and thereby form a patterned sacrificial layer 210. The position of the patterned sacrificial layer 210 may be in a first region 219, a second region 221 and a third region 223 of the semiconductor substrate 202. Afterwards, spacers 212 are formed on the sidewalls of the patterned sacrificial layer 210 through a deposition process and an etching process. Preferably, the dimensions of the spacers 212 are beyond the minimum feature size that a current exposure apparatus can print. That is to say, the spacers 212 belong to "sub-lithographic features."

The hard mask 208, the patterned sacrificial layer 210 and the spacers 212 may be made of isolation materials such as silicon oxide, silicon nitride, silicon oxynitride, silicon carbide and so forth, or made of semiconductor materials such as polysilicon or III-V group semiconductor materials, but are not limited thereto. Preferably, the etching rates of the hard mask 208, the patterned sacrificial layer 210 and the spacers 212 are different from one another.

The remaining steps of the spacer self-aligned double patterning (SADP) process are then carried out to transfer a pattern defined by the spacers 212 to the underlying epitaxial layer 208. Specifically, during the transferring process, the patterned sacrificial layer 210 is removed first so as to expose the underlying hard mask 208. Then, at least an etching process is carried out such that the layout pattern defined by the spacers 212 is sequentially transferred to the hard mask 208 and thereby forms a patterned hard mask 208.

Figure 4:
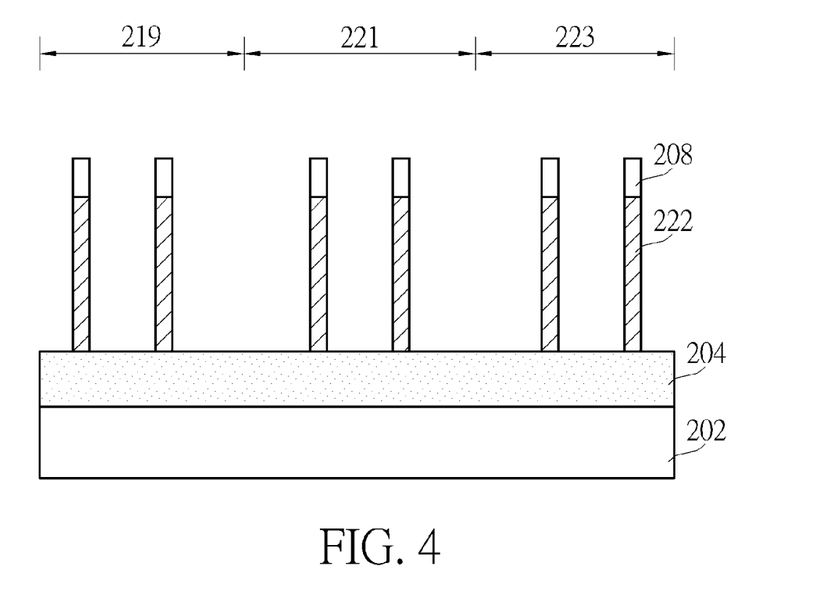
FIG. 4 is a cross-sectional diagram showing a semiconductor substrate with first fin-shaped structures.

After transferring the pattern defined by the spacers 212 to the underlying epitaxial layer 208, another etching process is carried out by using the patterned hard mask 208 as etch mask. As shown in FIG. 4, through the etching process, the layout pattern defined by the patterned hard mask 208 may be transferred to the underlying epitaxial layer so as to obtain a patterned epitaxial layer. The patterned epitaxial layer shown in FIG. 4 may be called a first fin-shaped structure 222. The etching process disclosed above may be a dry etch process, a wet etch process or a combination thereof. Preferably, the etchants used in the etching process include fluorinated compounds. A by-product, such as fluoride, generated from the etching process can accumulate on the sidewalls of the first fin-shaped structures 120 and inhibit the occurrence of lateral etch during the etching process.

Figure 5:
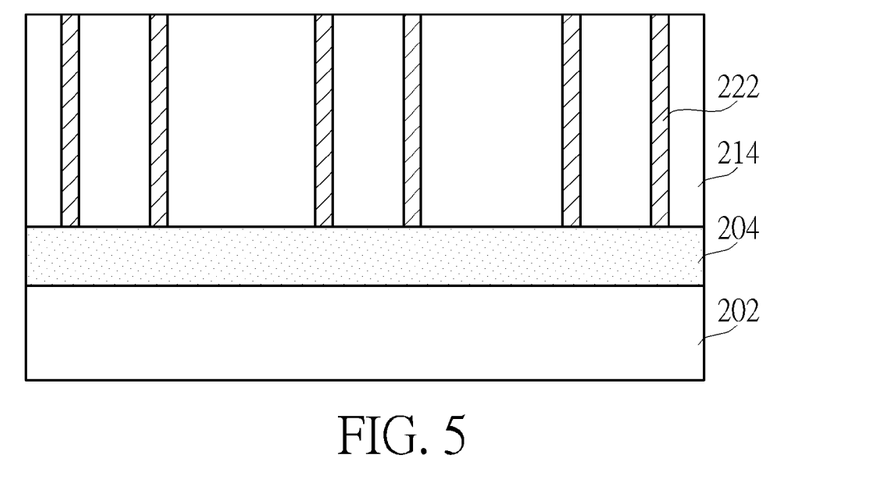
FIG. 5 is a cross-sectional diagram showing a semiconductor substrate with a dielectric layer thereon.

FIG. 5 is a cross-sectional diagram showing a semiconductor substrate with a dielectric layer thereon. After the step shown in FIG. 4, an isolation layer 214 is blank deposited on the semiconductor substrate 202 so as to fill up each shallow trench and cover the patterned hard mask 208 and the first fin-shaped structure 222. Afterwards, a polishing process, such as a chemical mechanical process (CMP), is carried out to planarize the isolation layer 214 until a top surface of the first fin-shaped structure 222 is level with a top surface of the isolation layer 214. The process of forming the isolation layer 214 may be a high density plasma CVD (HDPCVD) process, a sub-atmosphere CVD (SACVD) process, a spin on dielectric (SOD) process or a flowable chemical vapor deposition (FCVD) process, but is not limited thereto.

Figure 6:
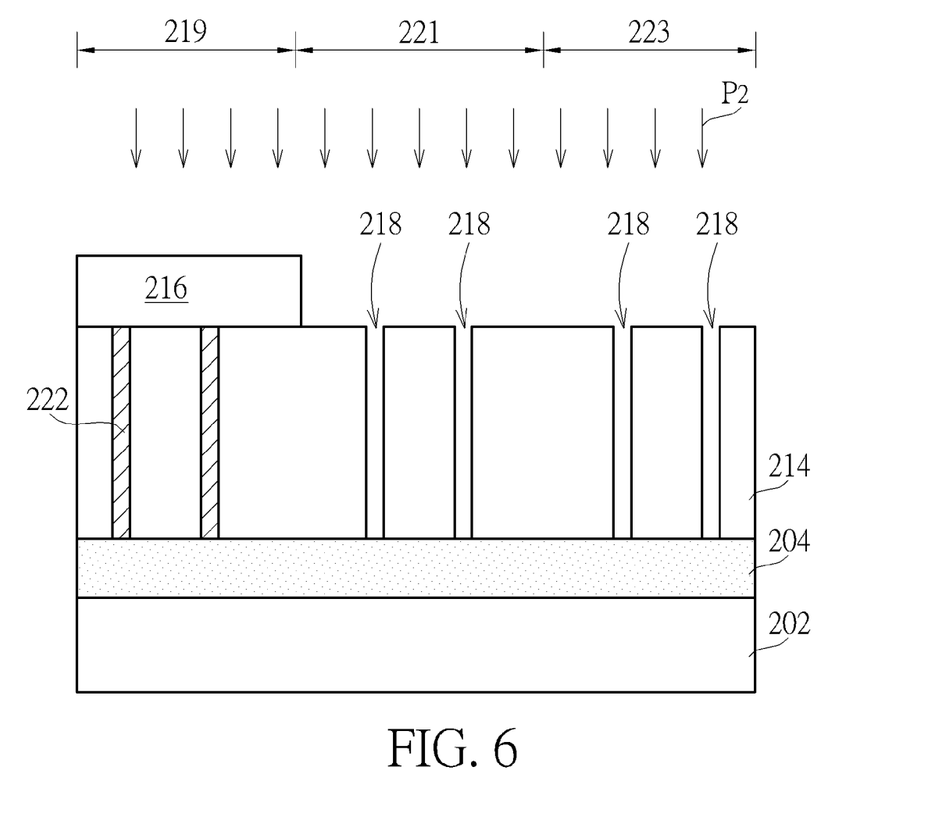
FIG. 6 is a schematic diagram showing a structure after the removal of portions of the first fin-shaped structure.

FIG. 6 is a schematic diagram showing a structure after the removal of portions of the first fin-shaped structure. After the step shown in FIG. 5, a mask 216 is formed on the isolation layer 214 so that the first fin-shaped structure 222 and the isolation layer 214 in the first region 219 are covered by the mask 216. The mask 216, for example, may be patterned photoresist or patterned dielectric layer, but is not limited thereto. Afterwards, by using the mask 216 as an etch mask, an etching process P2 is carried out to etch the first fin-shaped structure 222 in the second region 221 and the third region 223. Through the etching process P2, several trenches 218 may be formed in the second region 221 and the third region 223, and the doped region 204 may be exposed from the bottom of the trenches 218.

Figure 7:
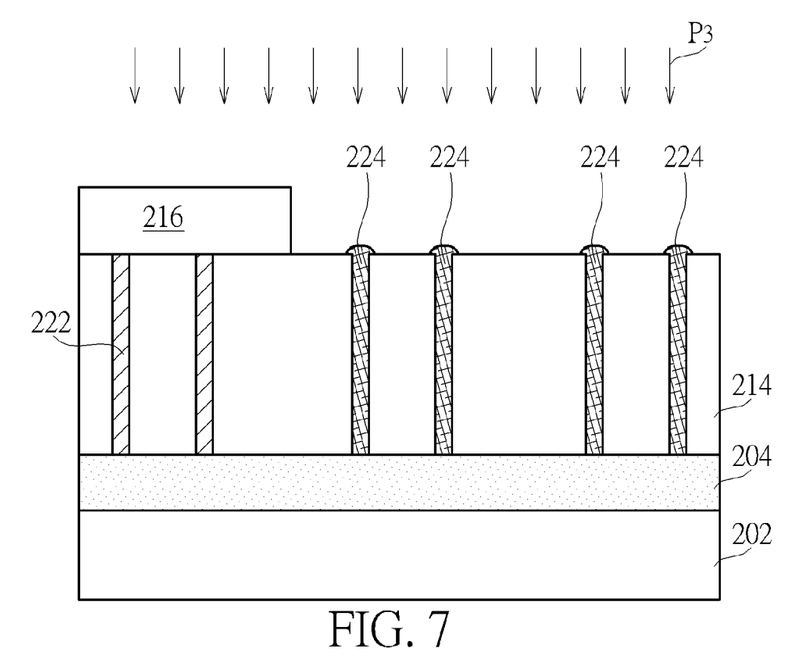
FIG. 7 is a cross-sectional diagram showing a structure after the step of forming a second fin-shaped structure in a second region and a third region.

FIG. 7 is a cross-sectional diagram showing a structure after the step of forming a second fin-shaped structure in a second region and a third region. After the step shown in FIG. 6, an epitaxial growth process, such as an in-situ epitaxial growth process, is carried out to form epitaxial layers, also called second fin-shaped structure 224, in the trenches 218 exposed from the mask 216. According to different requirements, the composition, dopants and/or doping concentration of the second fin-shaped structure 224 may be different from those of the first fin-shaped structure 222. Because the upper segments of the first fin-shaped structure 222 and the second fin-shaped structure 224 are used to define carrier channel regions of the following fabricated semiconductor device, the electrical properties of the semiconductor device, such as threshold voltage ($V_{TH}$), may be properly adjusted by finely modifying the composition, dopants and/or doping concentration of the first and second fin-shaped structures 222 and 224. In one case, the compositions of the second fin-shaped structure 224 and the first fin-shaped structure 222 may be silicon-germanium or silicon-phosphor respectively. In another case, the compositions of the second fin-shaped structure 224 and the first fin-shaped structure 222 may be the same, but the doping concentration of the second fin-shaped structure 224 may be higher than that of the first fin-shaped structure 222.

Subsequently, the mask 216 is removed. An optional planarization process is then carried out so as to remove the second fin-shaped structure 224 protruding from the top surface of the isolation layer 214 until the top surface of the second fin-shaped structure 224 is level with the top surface of the isolation layer 214.

Figure 8:
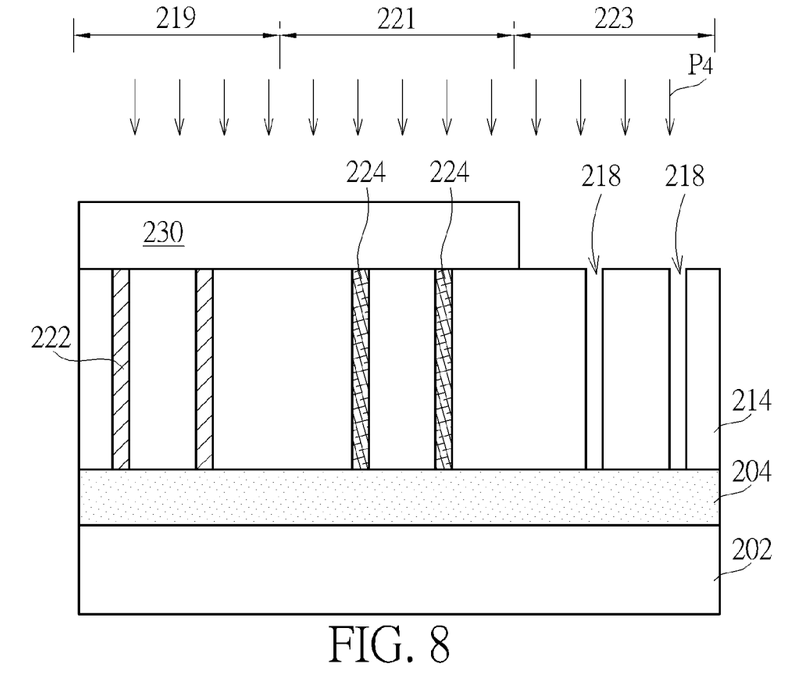
FIG. 8 is a cross-sectional diagram showing a semiconductor structure after the step of forming trenches in a third region of a semiconductor substrate.

FIG. 8 is a cross-sectional diagram showing a semiconductor structure after the step of forming trenches in a third region of a semiconductor substrate. After the above-mentioned planarization process, a mask 230 is formed to concurrently cover the first fin-shaped structure 222 in the first region 219 and the second fin-shaped structure 224 in the second region 221. The mask 230, as an example, may be patterned photoresist or patterned dielectric layer, but is not limited thereto. Afterwards, by using the mask 230 as an etch mask, an etching process P4 is carried out to etch the second fin-shaped structure 224 in the third region 223 until the doped region 204 is exposed.

Figure 9:
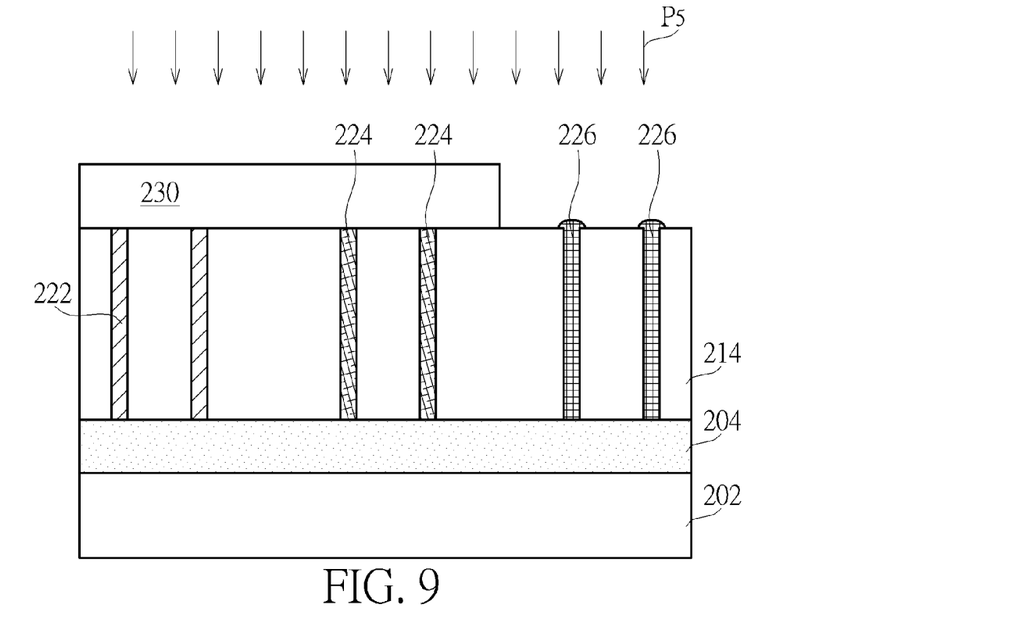
FIG. 9 is a cross-sectional diagram showing a structure after the step of forming a third fin-shaped structure in a third region.

FIG. 9 is a cross-sectional diagram showing a structure after the step of forming a third fin-shaped structure in a third region. After the step shown in FIG. 8, an epitaxial growth process, such as an in-situ epitaxial growth process, is carried out to form epitaxial layers, also called a third fin-shaped structure 226, in the trenches 218 exposed from the mask 230. According to different requirements, the composition, dopants and/or doping concentration of the third fin-shaped structure 226 may be different from those of the first fin-shaped structure 222 and the second fin-shaped structure 224. Because the upper segments of the third fin-shaped structure 226 are used to define carrier channel of the subsequently fabricated semiconductor device, the electrical properties of the semiconductor device, such as threshold voltage ($V_{TH}$), may be properly adjusted by finely modifying the composition, dopants and/or doping concentration of the third fin-shaped structure 226. In one case, the compositions of the third fin-shaped structure 226 may be silicon-germanium, and the compositions of second fin-shaped structure 224 and the first fin-shaped structure 222 may be silicon-phosphor respectively. In another case, the compositions of the first fin-shaped structure 222, second fin-shaped structure 224 and the third fin-shaped structure 226 may be the same, but the doping concentration of the third fin-shaped structure 226 may be higher than that of the first fin-shaped structure 222 and the second fin-shaped structure 224.

The mask 230 is then removed, and a planarization process is optionally carried out so that the top surface of the third fin-shaped structure 226 is level with the top surface of the isolation layer 214.

Figure 10:
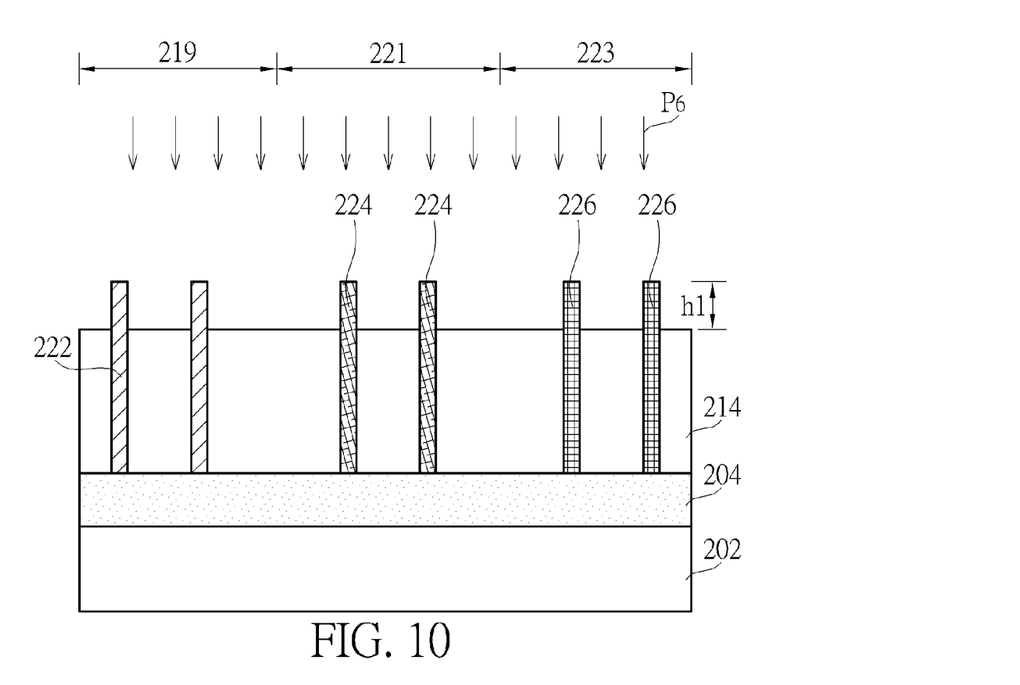
FIG. 10 is a cross-sectional diagram showing a structure where first, second and third fin-shaped structures partially protrude from an isolation layer.

FIG. 10 is a cross-sectional diagram showing a structure where first, second and third fin-shaped structures partially protrude from an isolation layer. After the step described above, an etching process P6 is carried out to etch the isolation layer 214 until its top surface is slightly lower than the top surfaces of the first fin-shaped structure 222, the second fin-shaped structure 224 and the third fin-shaped structure 226. The etched isolation layer 214 is also called a shallow trench isolation (STI). At this time, the protruding segments of the first, second and third fin-shaped structures 222, 224 and 226 may have the same height h1.

In addition, because the doped region 204 is formed before the steps of forming the first fin-shaped structure 222, the second fin-shaped structure 224 and the third fin-shaped structure 226, the lattice structures of these fin-shaped structures 222, 224 and 226 may not be damaged by the ion bombardment process. At this stage, the lower portions of the first fin-shaped structure 222, the second fin-shaped structure 224, and the third fin-shaped structure 226 are enclosed by the shallow trench isolation.

Figure 11:
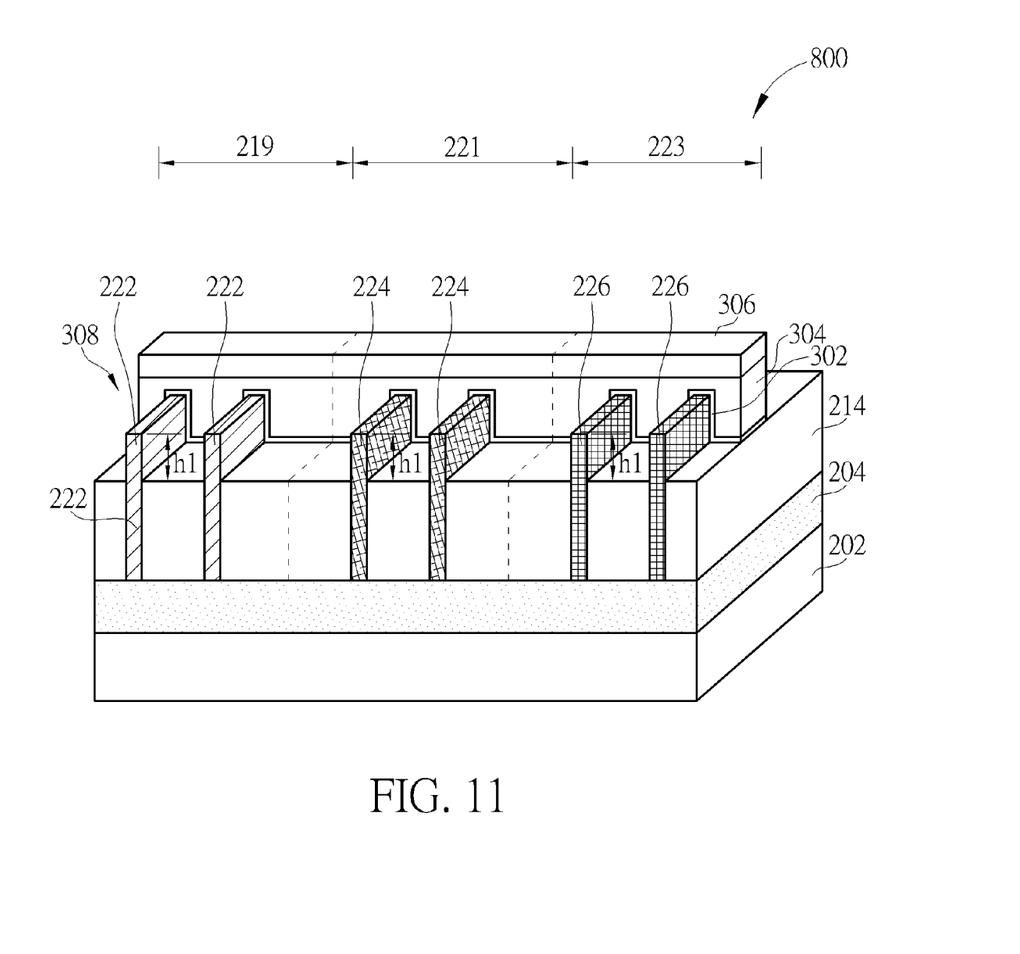
FIG. 11 is a perspective diagram showing a structure where first, second and third fin-shaped structures are partially covered by a dummy gate structure.

FIG. 11 is a perspective diagram showing a structure where first, second and third fin-shaped structures are partially covered by a dummy gate structure. After the step shown in FIG. 10, a gate dielectric layer 302, a sacrificial electrode layer 304 and a cap 306 are sequentially formed on the isolation layer 214 and the fin-shaped structures 222, 224 and 226. Then, the cap 306, the sacrificial electrode layer 304 and the gate dielectric layer 302 are sequentially patterned so as to form a stripe-shaped gate structure, or stripe-shaped dummy gate structure. The gate structure 30 crosses over two fin structures 12 and covers the isolation structure 20 between them. Specifically, dummy gate structure 308 may cover segments of the first, second and third fin-shaped structures 222, 224 and 226. Besides, although the dummy gate structure 308 shown in FIG. 11 is a continuous stripe crossing over the first, second and third fin-shaped structures 222, 224 and 226, the dummy gate structure 308 is preferably an interrupted stripe respectively disposed in the first region 219, the second region 221 and the third region 223.

Subsequently, other suitable fabrication processes may be carried out. For a multi-gate MOSFET fabricated by a gate-last process, for example, additional spacers may be further formed on the sidewalls of the dummy gate structure 308, and source/drain regions may be formed in the fin-shaped structures on the sides of the dummy gate structure 308. Preferably, the source/drain regions have a second conductivity type which is different from the first conductivity type of the underlying doped region 204. Then, an interlayer dielectric is deposited to completely cover the dummy gate structure 308, the spacers, the first fin-shaped structure 222, the second fin-shaped structure 224, the third fin-shaped structure 226 and the isolation layer 214. Afterwards, the interlayer dielectric and the cap 306 are planarized and etched until the top surfaces of the first fin-shaped structure 222, the second fin-shaped structure 224, and the third fin-shaped structure 226 are exposed. The sacrificial electrode 304 and the gate dielectric layer 302 in the dummy gate structure 308 are then sequentially removed so as to leave a trench between two opposite spacers. Afterwards, a high-k dielectric layer and a metal conductive layer are sequentially filled into the trench in order to fabricate required metal gate transistor.

According to the above embodiments, there are three contact faces between each fin structure and the gate dielectric layer, which serve as carrier channel region of the semiconductor device. Compared with planar MOSFETs, the tri-gate MOSFETs have wider channel width within the same channel length. When a driving voltage is applied, the tri-gate MOSFET may produce an on-current twice higher than conventional planar MOSFETs do.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device with fin-shaped structures, comprising:
    forming a plurality of first fin-shaped structures on a semiconductor substrate, wherein some of the first fin-shaped structures are in a first region of the semiconductor substrate and the other of the first fin-shaped structures are in a second region of the semiconductor substrate;
    depositing a dielectric layer on the semiconductor substrate to completely cover the first fin-shaped structures;
    removing the first-fin-shaped structures in the second region so as to form a plurality of trenches in the dielectric layer; and
    performing an in-situ doping epitaxial growth process so as to respectively form a plurality of second fin-shaped structures in the trenches.

2. The method of claim 1, further comprising performing another epitaxial growth process to form an epitaxial layer on the semiconductor substrate before the step of forming the first fin-shaped structures.

3. The method of claim 2, wherein the epitaxial growth process is an in-situ doping epitaxial growth process.

4. The method of claim 2, wherein the epitaxial layer is a single crystal made of silicon, germanium, silicon-germanium, silicon-phosphor or silicon carbide.

5. The method of claim 2, wherein the epitaxial layer has a doped concentration gradually changing from bottom to top.

6. The method of claim 2, wherein the step of forming the first fin-shaped structures comprises:
   forming a patterned etch mask to cover portions of the epitaxial layer; and
   etching the epitaxial layer by using the patterned etch mask as an etch mask.

7. The method of claim 2, further comprising forming a doped well-region and/or a punch-through stopper region in the surface of the semiconductor substrate before the step of forming the epitaxial layer.

8. The method of claim 1, further comprising performing a planarization process after the step of depositing the dielectric layer until top surfaces of the first fin-shaped structures are exposed from the dielectric layer.

9. The method of claim 1, further comprising forming a mask to cover the fin-shaped structures in the first region before the step of forming the trenches, wherein the fin-shaped structures in the first region are covered by the mask during the step of forming the trenches.

10. The method of claim 1, wherein the second fin-shaped structures have a conductivity type different from a conductivity type of the first fin-shaped structures.

11. The method of claim 1, wherein each of the second fin-shaped structures is a single crystal made of silicon, germanium, silicon-germanium, silicon-phosphor or silicon carbide.

12. The method of claim 11, further comprising forming a plurality of third fin-shaped structures, wherein each of the third fin-shaped structures is a single crystal made of silicon, germanium, silicon-germanium, silicon-phosphor or silicon carbide.

13. The method of claim 1, wherein each of the second fin-shaped structures has a dopant concentration gradually changing from bottom to top.

14. The method of claim 1, further comprising performing a planarization process after the step of performing the in-situ doping epitaxial growth process so that top surfaces of the second fin-shaped structures are level with a top surface of the dielectric layer during the planarization process.

15. The method of claim 1, further comprising etching the dielectric layer until the first fin-shaped structures and the second fin-shaped structures partially protrude from the dielectric layer, wherein the height of the first fin-shaped structures protruding from the dielectric layer is substantially equal to the height of the second fin-shaped structures protruding from the dielectric layer.

16. The method of claim 15, further comprising forming a dummy gate structure on the dielectric layer to cover the first fin-shaped structures protruding from the dielectric layer and the second fin-shaped structures protruding from the dielectric layer.

17. The method of claim 1, wherein the first fin-shaped structures are further disposed in a third region of the semiconductor substrate, the method further comprising:
   concurrently removing the first fin-shaped structures in the second region and the third region so as to form the trenches in the dielectric layer;
   performing the in-situ doping epitaxial growth process so as to form the second fin-shaped structures respectively in the trenches;
   removing the second fin-shaped structures in the third region so as to expose the trenches in the third region; and
   performing another in-situ doping epitaxial growth process so as to form a plurality of third fin-shaped structures respectively in the trenches.

18. The method of claim 17, wherein the third fin-shaped structures have a conductivity type different from a conductivity type of the first fin-shaped structures.

19. The method of claim 17, further comprising etching the dielectric layer until the first fin-shaped structures, the second fin-shaped structures and the third fin-shaped structures partially protrude from the dielectric layer, wherein the first fin-shaped structures protruding from the dielectric layer, the second fin-shaped structures protruding from the dielectric layer and the third fin-shaped structures protruding from the dielectric layer have the same height.

20. The method of claim 19, further comprising forming a dummy gate structure on the dielectric layer so as to cover the first fin-shaped structures protruding from the dielectric layer, the second fin-shaped structures protruding from the dielectric layer and the third fin-shaped structures protruding from the dielectric layer.

* * * * *